United States Patent [19]

Hashimoto

[11] Patent Number: 5,717,640
[45] Date of Patent: Feb. 10, 1998

[54] ROM TYPE SEMICONDUCTOR MEMORY DEVICE WITH LARGE OPERATING MARGIN

[75] Inventor: Kiyokazu Hashimoto, Tokyo, Japan

[73] Assignee: NEC Corporation, Tokyo, Japan

[21] Appl. No.: 723,276

[22] Filed: Sep. 30, 1996

[30] Foreign Application Priority Data

Sep. 28, 1995 [JP] Japan .................. 7-274843

[51] Int. Cl.$^6$ .................. G11C 7/00; G11C 7/02; G11C 11/34
[52] U.S. Cl. .................. 365/189.07; 365/189.09; 365/210; 365/185.2
[58] Field of Search .................. 365/189.07, 189.09, 365/210, 185.2

[56] References Cited

U.S. PATENT DOCUMENTS

| | | |
|---|---|---|
| 4,761,765 | 8/1988 | Hashimoto .................. 365/210 |
| 5,241,505 | 8/1993 | Hashimoto .................. 365/210 |
| 5,293,333 | 3/1994 | Hashimoto .................. 365/210 |
| 5,305,260 | 4/1994 | Ninomiya .................. 365/189.09 |
| 5,555,217 | 9/1996 | Hashimoto .................. 365/210 |

*Primary Examiner*—David C. Nelms
*Assistant Examiner*—Trong Quang Phan
*Attorney, Agent, or Firm*—Sughrue, Mion, Zinn, Macpeak & Seas, PLLC

[57] ABSTRACT

In a semiconductor memory device including a memory cell array, a sense amplifier for sensing a voltage of a selected one of read-only memory cells of the memory cell array, a dummy memory cell array, a reference voltage generating circuit for sensing a voltage at the output of the dummy memory cell array, and a comparator for comparing a sense voltage of the sense amplifier with a reference voltage of the reference voltage generating circuit, a bias circuit supplies a bias current from a power supply terminal to the output of the sense amplifier and also supplies a bias current from the power supply terminal to the output of the reference voltage generating circuit.

12 Claims, 14 Drawing Sheets

ROM TYPE SEMICONDUCTOR MEMORY DEVICE WITH LARGE OPERATING MARGIN

BACKGROUND OF THE INVENTION

1. Field of the Invention

The present invention relates to a semiconductor memory device including read-only memory (ROM) cells, and more particularly, to an improvement in the operating margin of such a semiconductor memory device at a lower power supply voltage.

2. Description of the Related Art

A prior art ROM device includes a memory cell array, a sense amplifier for sensing a voltage of a selected ROM cell in the memory cell array, a dummy memory cell array, a reference voltage generating circuit for sensing a voltage at the output of the dummy memory cell array, and a comparator for comparing a sense voltage from the sense amplifier with a reference voltage of the reference voltage generating circuit. This will be explained later in detail.

In the above-mentioned prior art ROM device, however, the high output level of the sense amplifier is lower than a power supply voltage. Therefore, when the power supply voltage becomes low, for example, lower than 3 V, the operating margin of the device is remarkably reduced.

SUMMARY OF THE INVENTION

It is an object of the present invention to increase an operating margin of a ROM device even when the power supply voltage is low.

According to the present invention, in a semiconductor memory device including a memory cell array, a sense amplifier for sensing a voltage of a selected read-only memory cell in the memory cell array, a dummy memory cell array, a reference voltage generating circuit for sensing a voltage at the output of the dummy memory cell array, and a comparator for comparing a sense voltage from the sense amplifier with a reference voltage of the reference voltage generating circuit, a bias circuit supplies a bias current from a power supply terminal to the output of the sense amplifier and also supplies a bias current from the power supply terminal to the output of the reference voltage generating circuit. Thus, the high output level of the sense amplifier is the same as the power supply voltage, due to the bias circuit, and accordingly, the operating margin of the device becomes large.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the preferred embodiment is described, a prior art ROM device will be explained with reference to FIGS. 1, 2A, 2B, 3A, 3B, 4 and 5.

Figure 1:
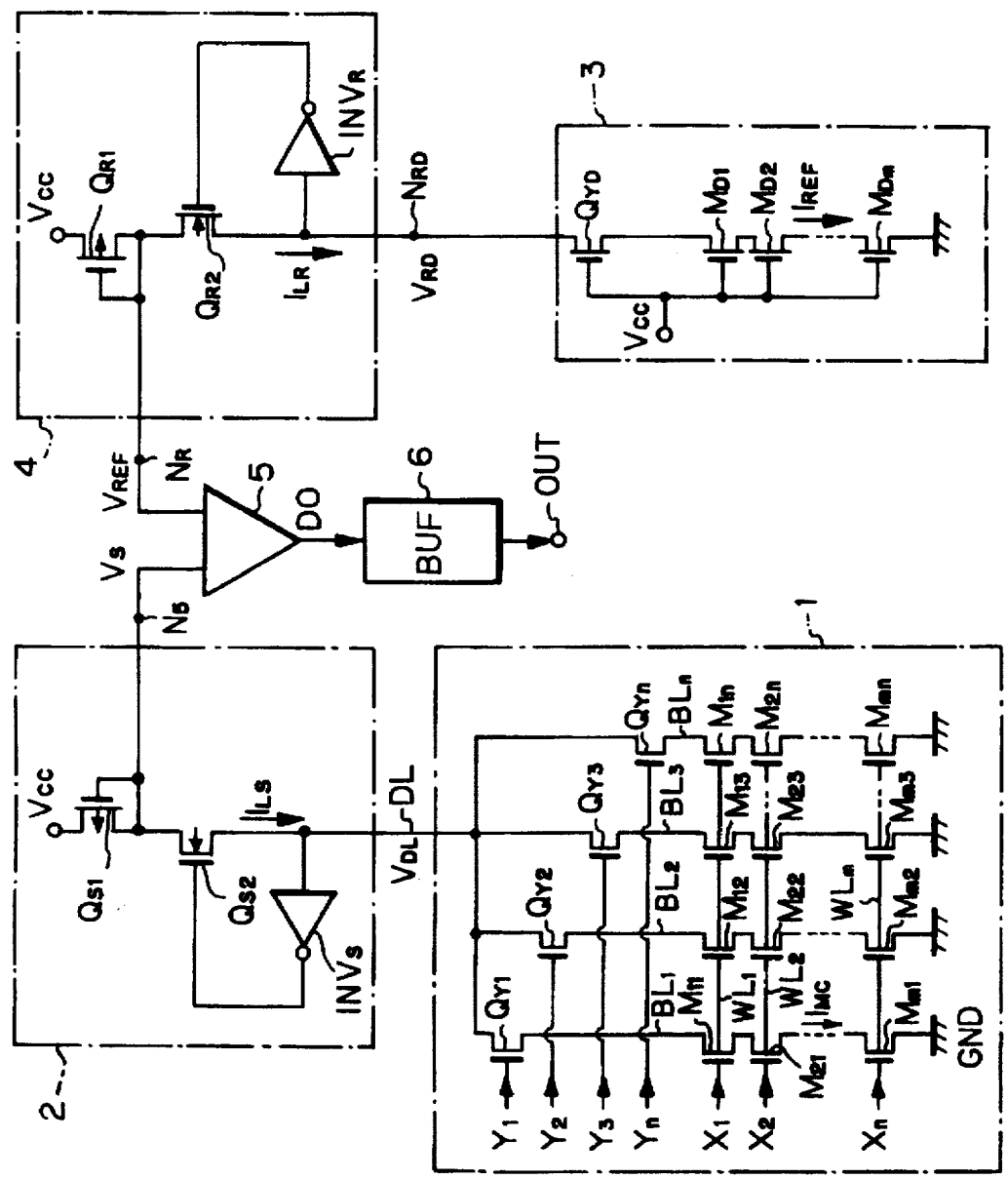
FIG. 1 prior art is a circuit diagram illustrating a prior art ROM type semiconductor memory device.

In FIG. 1, which illustrates a prior art ROM device, reference numeral 1 designates a NAND type memory cell array formed by nonvolatile memory cells $M_{11}, M_{12}, \ldots, M_{mn}$. In this case, the memory cells $M_{11}, M_{12}, \ldots, M_{m1}$ are connected in series between a bit line $BL_1$ and a ground voltage terminal GND; the memory cells $M_{12}, M_{22}, \ldots, M_{m2}$ are connected in series between a bit line $BL_2$ and the ground voltage terminal GND; ...; the memory cells $M_{1n}, M_{2n}, \ldots, M_{mn}$ are connected in series between a bit line $BL_n$ and the ground voltage terminal GND. Also, the gates of the memory cells $M_{11}, M_{12}, \ldots, M_{1n}$ are connected to a word line $WL_1$; the gates of the memory cells $M_{21}, M_{22}, \ldots, M_{2n}$ are connected to a word line $WL_2$; ...; the gates of the memory cells $M_{m1}, M_{m2}, \ldots, M_{mn}$ are connected to a word line $WL_m$.

The word lines $WL_1, WL_2, \ldots, WL_m$ are selected by X address signals $X_1, X_2, \ldots, X_m$, respectively.

The bit lines $BL_1, BL_2, \ldots, BL_n$ are connected via column selection transistors (N-channel enhancement type MOS transistors) $Q_{Y1}, Q_{Y2}, \ldots, Q_{Yn}$ to a digit line DL. The column selection transistors $Q_{Y1}, Q_{Y2}, \ldots, Q_{Yn}$ are selected by Y address signals $Y_1, Y_2, \ldots, Y_n$, respectively.

One of the X address signals $X_1, X2, \ldots, X_m$, is made low by a row decoder (not shown), and therefore, one of the word lines $WL_1, WL_2, \ldots, WL_m$ is selected. Similarly, one of the Y address signals $Y_1, Y_2, \ldots, Y_n$, is made high by a column decoder (not shown), and therefore, one of the bit lines $BL_1, BL_2, \ldots, BL_n$ is selected and is connected to the digit line DL. Thus, one bit data is read from a selected memroy cell to the digit line DL.

Reference numeral 2 designates a sense amplifier for sensing a voltage at the digit line DL, i.e., an output voltage of the memory cell array 1. The sense amplifier 2 is formed by a P-channel enhancement type MOS transistor $Q_{S1}$ as a load connected between a power supply terminal $V_{CC}$ whose voltage is also denoted by $V_{CC}$ and a node $N_S$, an N-channel enhancement type MOS transistor $Q_{S2}$ connected between the node $N_S$ and the digit line DL, and an inverter $INV_S$ connected between the source and gate of the transistor $Q_{S2}$. In this case, the gate of transistor $Q_{S1}$ is connected to the drain thereof. When the voltage at the digit line DL is high, the voltage at the gate of the transistor $Q_{S2}$ is made low by the inverter $INV_S$, so that the transistor $Q_{S2}$ is turned OFF, and accordingly, the voltage at the node $N_S$ is high. On the other hand, when the voltage at the digit line DL is low, the voltage at the gate of the transistor $Q_{S2}$ is made high by the inverter $INV_S$, so that the transistor $Q_{S2}$ is turned ON, and accordingly, the voltage at the node $N_S$ is low.

Reference numeral 3 designates a dummy memory cell array formed by reference cells or dummy cells $M_{D1}$, $M_{D2}$, ..., $M_{Dm}$ having the same channel width (W) and channel length (L) as the memory cells $M_{11}$, $M_{12}$, ..., $M_{mn}$, and an N-channel enhancement-type MOS transistor $Q_{YD}$ corresponding to one of the column selection transistors $Q_{Y1}$, $Q_{Y2}$, ..., $Q_{Yn}$. In this case, the voltage $V_{CC}$ is applied to the gates of the dummy cells $M_{D1}$, $M_{D2}$, ..., $M_{Dm}$ and the transistor $Q_{YD}$, and therefore, the dummy cells $M_{D1}$, $M_{D2}$, ..., $M_{Dm}$ and the transistor $Q_{YD}$ are normally turned ON.

Reference numeral 4 designates a reference voltage generating circuit for sensing an output voltage of the dummy memory cell array 3. The reference voltage Generating circuit 4 has the same configuration as the sense amplifier 2. That is, the reference voltage generating circuit 4 is formed by a P-channel enhancement type MOS transistor $Q_{R1}$ as a load connected between the power supply terminal $V_{CC}$ and a node $N_R$, an N-channel enhancement type MOS transistor $Q_{R2}$ connected between the node $N_R$ and the dummy memory cell array 3, and an inverter $INV_R$ connected between the source and gate of the transistor $Q_{R2}$. In this case, the gate of the transistor $Q_{R1}$ is connected to the drain thereof.

The reference voltage $V_{REF}$ of the reference voltage generating circuit 4 is caused to be an intermediate level between a high output voltage $V_S$ (off) and a low output voltage $V_S$ (on) of the sense amplifier 2. Note that the sense amplifier 2 generates the high output voltage $V_S$ (off) when a selected memory cell stores data "1", while the sense amplifier 2 generates the low output voltage $V_S$ (on) when a selected memory cell stores data "0". For this purpose, the size of the transistor $Q_{R1}$ is larger than that of the transistor $Q_{S1}$. For example, the channel width/channel length (W/L) of the transistor $Q_{S1}$ is 5 μm/4 μm, while the channel width/channel length (W/L) of the transistor $Q_{R1}$ is 5μm/2 μm. Also, in this case, the channel width/channel length (W/L) of the transistors $Q_{S2}$ and $Q_{R2}$ is 20 μm/1.0 μm. Further, the inverter $INV_S$ has the same input/output characteristics as the inverter $INV_R$.

Reference numeral 5 designates a comparator for comparing the output voltage $V_S$ of the sense amplifier 2 with the output voltage $V_{REF}$ of the reference voltage generating circuit 4 to generate an output signal DO. For example, if $V_S \leq V_{REF} - \alpha$, the output signal DO of the comparator 5 is high. On the other hand, if $V_S \geq V_{REF} + \alpha$, the output signal DO of the comparator 5 is low. In this case, α is about 0.2 V.

Reference numeral 6 designates an output buffer for outputting the output signal DO of the comparator 5.

In the device of FIG. 1, binary data "1" or "0" of a memory cell corresponds to the enhancement type or depletion type of a transistor. For example, the memory cell $M_{11}$ is selected by the following conditions:

$X_1 = 0$ V $X_2 \sim X_m = V_{CC}$ $Y_1 = V_{CC}$ $Y_2 \sim Y_n = 0$V.

If the selected memory cell $M_{11}$ stores "1" (enhancement-type), the memory cell $M_{11}$ is turned OFF, so that the digit line DL is charged. As a result, the output voltage $V_S$ of the sense amplifier 2 becomes $V_S$ (off). That is, $$V_S = V_S \text{ (off)} > V_{REF}$$

Thus, the output signal DO of the comparator 5 becomes low, and accordingly, the voltage at the output terminal OUT becomes high.

On the other hand, if the selected memory cell $M_{11}$ stores "0" (depletion-type), the memory cell $M_{11}$ is turned ON, so that the digit line DL is discharged. As a result, the output voltage $V_S$ of the sense amplifier 2 becomes $V_S$ (on). That is, $$V_S = V_S \text{ (on)} < V_{REF}$$

Thus, the output signal DO of the comparator 5 becomes high, and accordingly, the voltage at the output terminal OUT becomes low.

Hereinafter, it is assumed that the threshold voltages $V_{TP}$ of the P-channel enhancement-type MOS transistors are the same, for example, $-1.0$ V, and the threshold voltages $V_{TN}$ of the N-channel enhancement-type MOS transistors are the same, for example, 0.7 V. Also, it is assumed that the memory cell $M_{11}$ is of a depletion type, and the other memory cells $M_{12}$, ..., $M_{mn}$ are of an enhancement type.

The operation of the device of FIG. 1 where $V_{CC} = 5$ V will be explained with reference to FIGS. 2A and 2B.

Figure 2A:
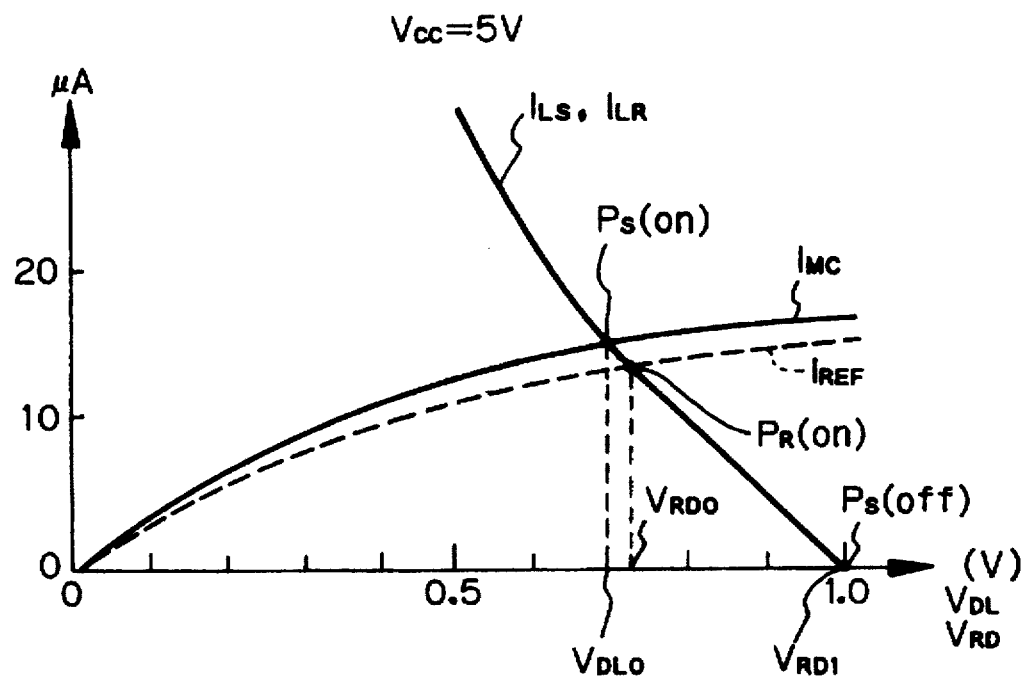
FIG. 2A prior art is a graph showing the current characteristics of the device of FIG. 1 where $V_{CC}=5$ V.

As shown in FIG. 2A, the dummy memory cell array 3 is designed so that a memory cell current $I_{MC}$ in relation to the voltage $V_{DL}$ at the digit line DL is brought close to a reference current $I_{REF}$ in relation to the voltage $V_{RD}$ at a node $N_{RD}$.

On the other hand, a load current $I_{LS}$ flowing through the sense amplifier 2 depends upon the current driving abilities of the transistors $Q_{S1}$ and $Q_{S2}$ and the input/output characteristics of the inverter $INV_S$; however, since the gate of the transistor $Q_{S2}$ is controlled by the inverter $INV_S$, the load current $I_{LS}$ depends upon only the current driving ability of the transistor $Q_{S2}$ and the input/output characteristics of the inverter $INV_S$. Similarly, a load current $I_{LR}$ flowing through the reference voltage generating circuit 4 depends upon the current driving abilities of the transistors $Q_{R1}$ and $Q_{R2}$ and the input/output characteristics of the inverter $INV_R$; however, since the gate of the transistor $Q_{R2}$ is controlled by the inverter $INV_R$, the load current $I_{LR}$ depends upon only the current driving abilitiy of the transistor $Q_{R2}$ and the input/output characteristics of the inverter $INV_R$. In this case, as stated above, since the transistor $Q_{S2}$ and the inverter $INV_S$ have the same characteristics as the transistor $Q_{S2}$ and the inverter $INV_R$, respectively, the characteristics of the load current $I_{LS}$ are substantially the same as those of the load current $I_{LR}$, as shown in FIG. 2A.

If a selected memory cell stores "1" (enhancement-type), the sense amplifier 2 is operated at an operating point $P_S$ (off) of FIG. 2A where $V_{DL} = V_{DL1}$. On the other hand, if a selected memory cell stores (depletion-type), the sense amplifier 2 is operated at an operating point $P_S$ (on) of FIG. 2A where $V_{DL} = V_{DLO}$, and the reference voltage generating circuit 4 is operated at an operating point $P_R$ (on) where $V_{RD} = V_{RDO}$.

Figure 2B:
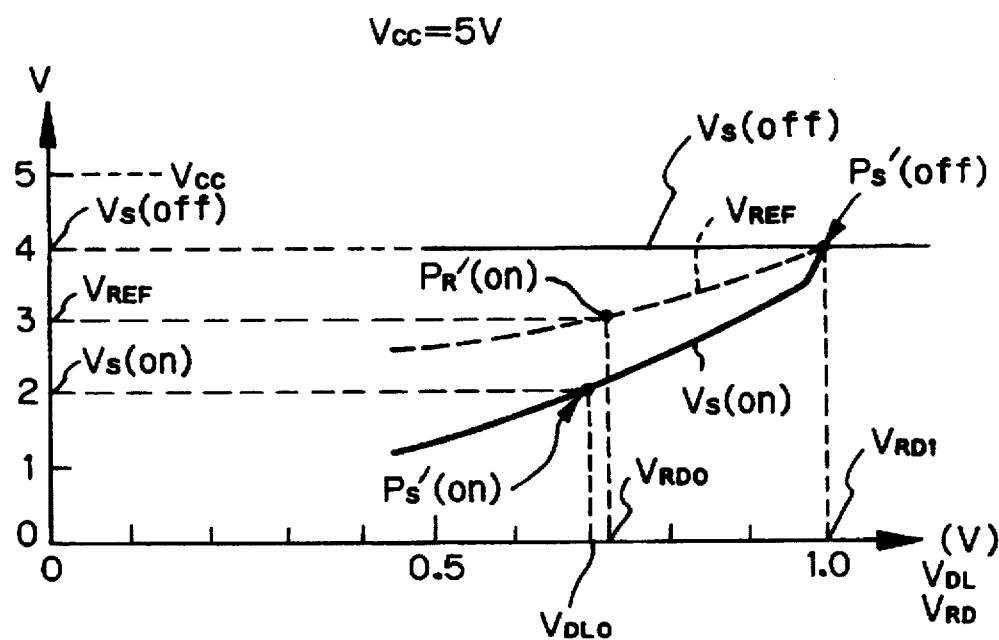
FIG. 2B prior art is a graph showing the voltage characteristics of the device of FIG. 1 where $V_{CC}=5$ V.

As shown in FIG. 2B, since the load transistor $Q_{R1}$ of the reference voltage generating circuit 4 is larger than the load transistor $Q_{S1}$ of the sense amplifier 2, the reference voltage $V_{REF}$ of the reference voltage generating circuit 4 is higher than the low sense voltage $V_S$ (on) of the sense amplifier 2. Note that operating points $P_S'$ (off), $P_S'$ (on) and $P_R'$ (on) of FIG. 2B correspond to the operating points $P_S$ (off), $P_S$ (on) and $P_R$ (on), respectively, of FIG. 2A.

If a selected memory cell stores "1" (enhancement-type), the sense amplifier 2 is operated at the operating point $P_S$ (off) of FIG. 2A and the operating point $P_S'$ (off) of FIG. 2B. Therefore, the high sense voltage $V_S$ (off) of the sense amplifier 2 is represented by $$V_S(\text{off}) = V_{CC} - |V_{TP}| \quad (1)$$
$$= 5V - 1.0V$$
$$= 4V$$

If a selected memory cell stores "0" (depletion-type), the sense amplifier 2 is operated at the operating point $P_S$ (on) of FIG. 2A and the operating point $P_S'$ (on) of FIG. 2B. Therefore, the low sense voltage $V_S$ (on) of the sense amplifier 2 is represented by $$V_S(\text{on}) = V_{CC} - |V_{TP}| - \beta > V_{INVS} = 1V \quad (2)$$

where $\beta$ is determined by the load current $I_{LS}$ and the current driving ability of the load transistor $Q_{S1}$; and $V_{INVS}$ is a threshold voltage such as 1 V of the inverter $INV_S$.

For example, if $\beta = 2.0$ V, $$V_S(\text{on}) = 5V - 1.0V - 2.0V \quad (2)$$
$$= 2V$$

Also, in the dummy memory cell array 3, the reference current $I_{REF}$ always flows therethrough. Therefore, the reference voltage generating circuit 4 is operated at the operating point $P_R$ (on) of FIG. 2A and the operating point $P_R'$ (on) of FIG. 2B. Therefore, the reference voltage $V_{REF}$ of the reference voltage generating circuit 4 is represented by $$V_{REF}(\text{on}) = V_{CC} - |V_{TP}| - \tau > V_{INVR} = 1V$$

where $\tau$ is determined by the load current $I_{LR}$ and the current driving ability of the load transistor $Q_{R1}$; and $V_{INVR}$ is a threshold voltage such as 1 V of the inverter $INV_R$.

For example, if $\tau = 2.0$ V, $$V_{REF} = 5V - 1.0V - 2.0V \quad (3)$$
$$= 2V$$

Thus, in this case, in view of the formulae (1), (2) and (3), $$V_S(\text{off}) - V_{REF} = 1 \, V > \alpha = 0.2 \, V$$

$$V_{REF} - V_S(\text{on}) = 1 \, V > \alpha = 0.2 \, V$$

Therefore, the comparator 5 is surely operable by the sense voltage $V_S$ of the sense amplifier 2 and the reference voltage $V_{REF}$ of the reference voltage generating circuit 4.

The operation of the device of FIG. 1 where $V_{CC} = 3$ V will be explained with reference to FIGS. 3A and 3B, which correspond to FIGS. 2A and 2B, respectively.

Figure 3A:
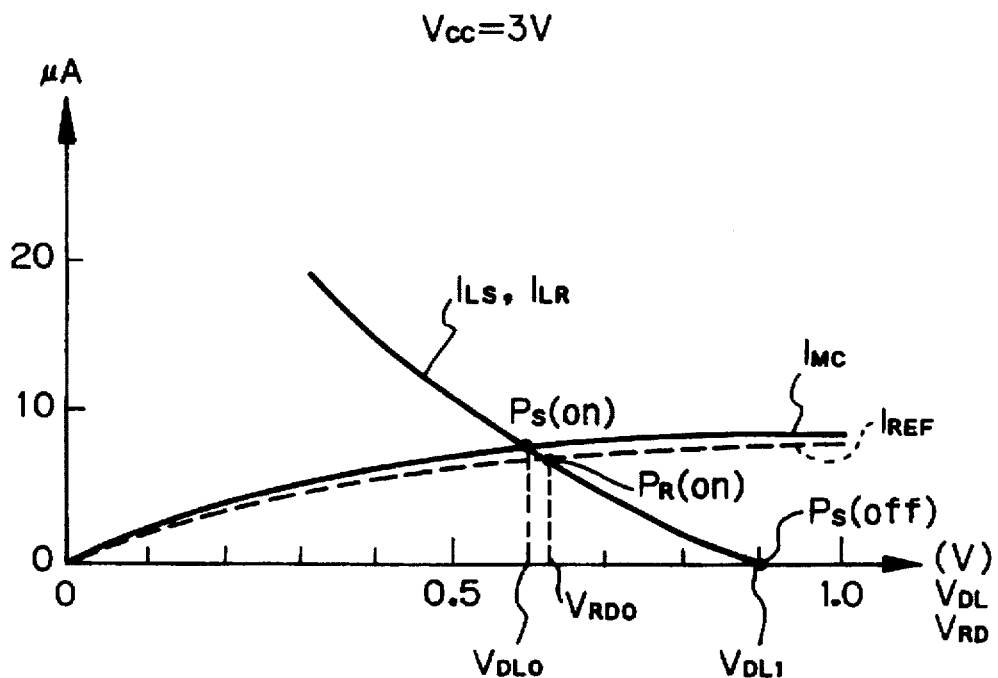
FIG. 3A prior art is a graph showing the current characteristics of the device of FIG. 1 where $V_{CC}=3$ V.

As shown in FIG. 3A, the load currents $I_{LS}$ and $I_{LR}$, the current $I_{MC}$ and the reference current $I_{REF}$ are reduced as compared with those of FIG. 2A.

Also, as shown in FIG. 3A, since the threshold voltage $V_{INVS}$ of the inverter $INV_S$ is reduced, the operating point $P_S$ (off) is moved to a lower voltage.

Figure 3B:
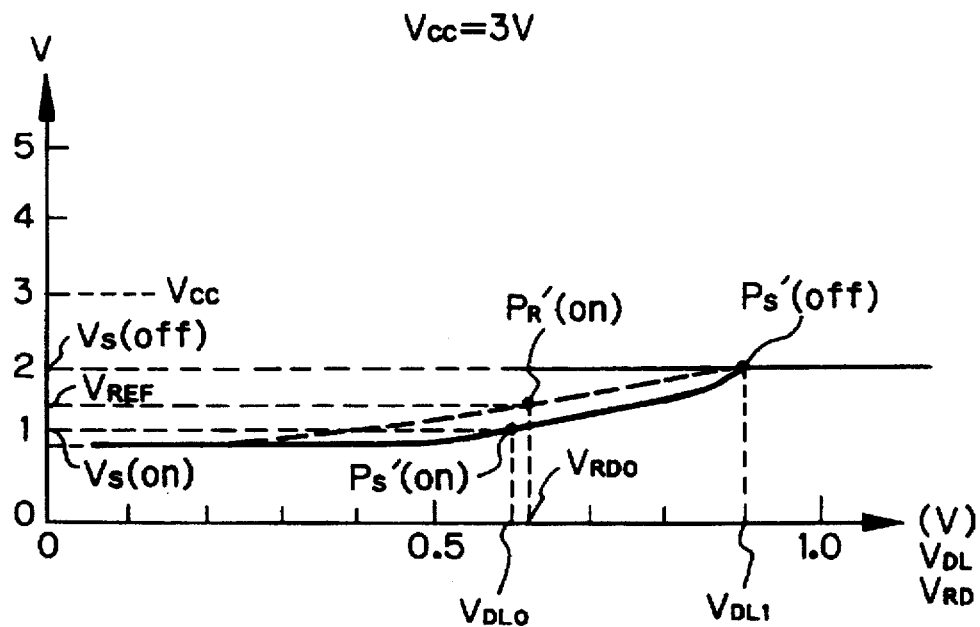
FIG. 3B prior art is a graph showing the voltage characteristics of the device of FIG. 1 where $V_{CC}=3$ V.

If a selected memory cell stores "1" (enhancement-type), the sense amplifier 2 is operated at the operating point $P_S$ (off) of FIG. 3A and the operating point $P_S'$ (off) of FIG. 3B. Therefore, the high sense voltage $V_S$ (off) of the sense amplifier 2 is represented by $$V_S(\text{off}) = V_{CC} - |V_{TP}| \quad (1)'$$
$$= 3V - 1.0V$$
$$= 2V$$

If a selected memory cell stores "0" (depletion-type), the sense amplifier 2 is operated at the operating point $P_S$ (on) of FIG. 3A and the operating point $P_S'$ (on) of FIG. 3B. Therefore, the low sense voltage $V_S$ (on) of the sense amplifier 2 is also represented by $$V_S(\text{on}) = V_{CC} - |V_{TP}| - \beta > V_{INVS}$$

For example, if $\beta = 0.8$ V, $$V_S(\text{on}) = 3V - 1.0V - 0.8V \quad (2)'$$
$$= 1.2V$$

Also, the reference voltage generating circuit 4 is operated at the operating point $P_R$ (on) of FIG. 3A and the operating point $P_R'$ (on) of FIG. 3B. Therefore, the reference voltage $V_{REF}$ of the reference voltage generating circuit 4 is also represented by $$V_{REF}(\text{on}) = V_{CC} - |V_{TP}| - \tau > V_{INVR}$$

For example, if $\tau = 0.5$ V, $$V_{REF} = 3V - 1.0V - 0.5V \quad (3)'$$
$$= 1.5V$$

Thus, in this case, in view of the formulae (1)', (2)' and (3)', $$V_S(\text{off}) - V_{REF} = 0.5 \, V > \alpha = 0.2 \, V$$

$$V_{REF} - V_S(\text{on}) = 0.3 \, V > \alpha = 0.2 \, V$$

Therefore, although the comparator 5 is operable by the sense voltage $V_S$ of the sense amplifier 2 and the reference voltage $V_{REF}$ of the reference voltage generating circuit 4, a noise margin and a margin for the fluctuations in process parameters are both very small.

Figure 4:
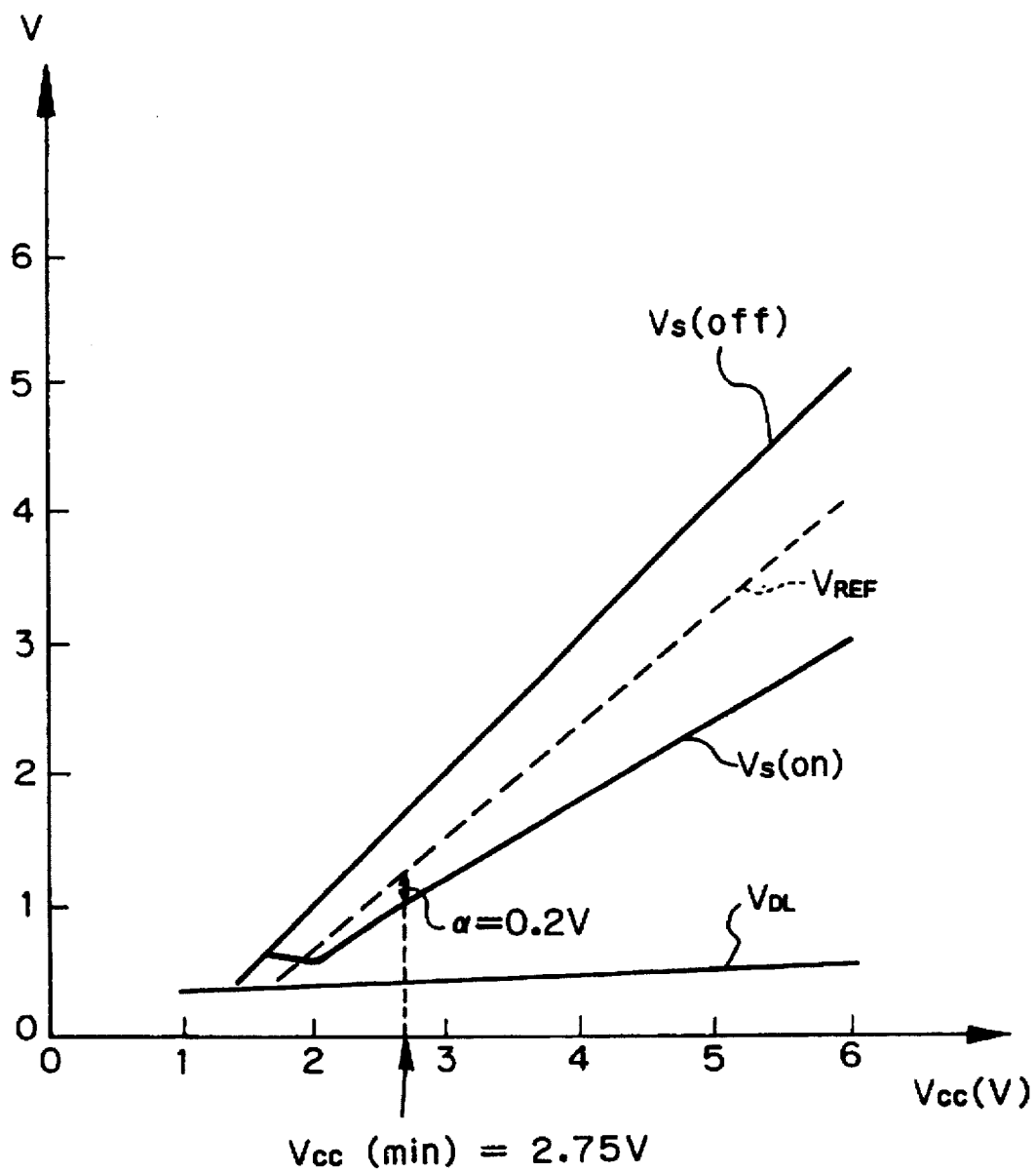
FIG. 4 prior art is a graph showing the output characteristics of the sense amplifier and the reference voltage generating circuit of FIG. 1.

In FIG. 4, which shows the output characteristics of the sense amplifier 2 and the reference voltage generating circuit 4 of FIG. 1, the high sense voltage $V_S$ (off), the low sense voltage $V_S$ (on) and the reference voltage $V_{REF}$ are changed in accordance with the power supply voltage $V_{CC}$. In this case, as represented by the formulae (1)–(3) and (1)'–(3)', the voltages $V_S$ (off), $V_S$ (on) and $V_{REF}$ are dependent upon the power supply voltage $V_{CC}$. Also, the voltage $V_S$ (on) is limited by the lower limit $V_{INVS}$ which is the threshold voltage of the inverter $INV_S$. Therefore, even when the reference voltage $V_{REF}$ is at an intermediate level between the voltages $V_S$ (off) and $V_S$ (on), a minimum value of the power supply voltage $V_{CC}$ is only 2.75 V in view of the operating margin $\alpha(=0.2 \, V)$ of the comparator 5.

Thus, the device of FIG. 1 is not suitable for a lower power supply voltage.

Figure 5:
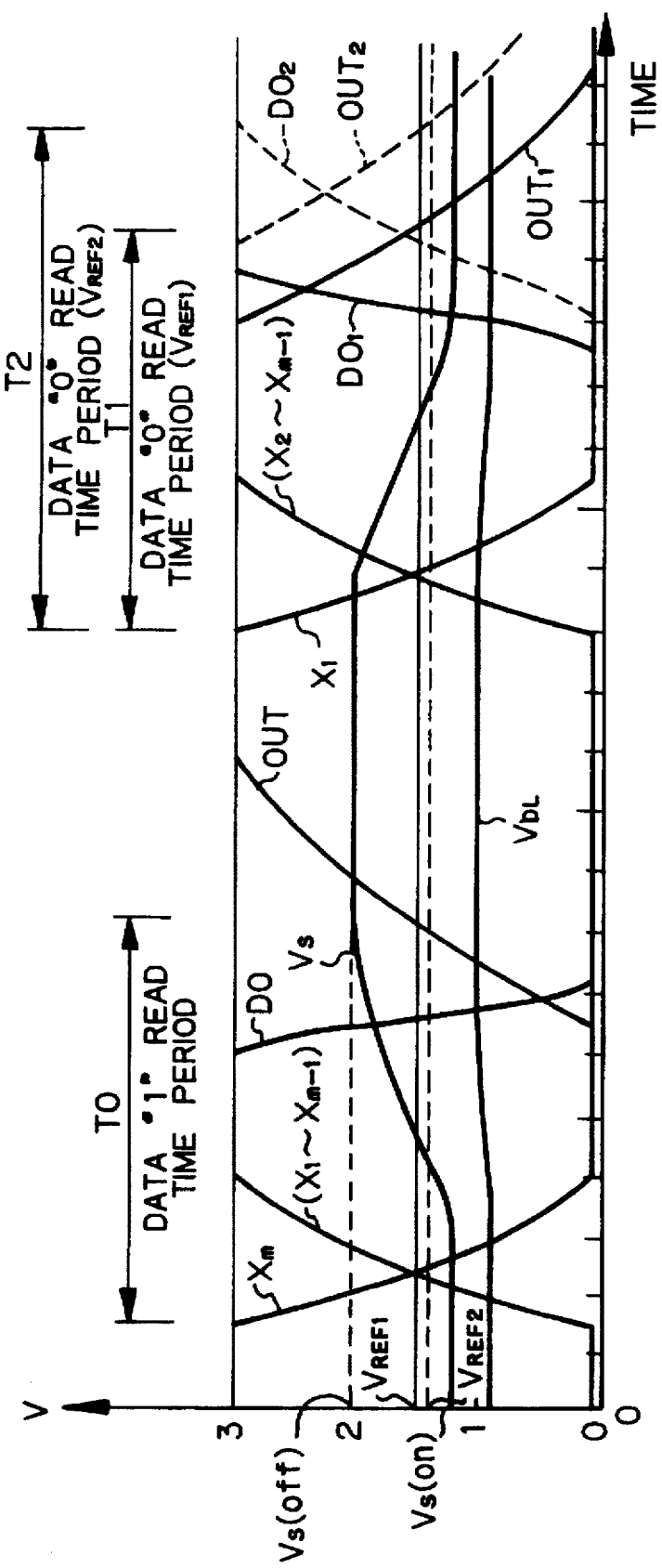
FIG. 5 prior art is a timing diagram showing a read operation of the device of FIG. 1.

Also, the read access speed greatly fluctuates. That is, as shown in FIG. 5, which shows a read operation of the device of FIG. 1 where $V_{CC}$=3 V, if is assumed that $V_S$ (off)=2.0 V, $V_S$ (on)=1.2 V and $V_{REF}$=$V_{REF1}$ (=1.5 V), a read time period for reading data "1" is T0, and a read time period for reading "0" is T1. In this case, if the reference voltage $V_{REF}$ is changed from $V_{REF1}$ to $V_{REF2}$ (=1.4 V) due to the fluctuation of the process parameters, a read time period for reading data "0" is T2 and is much longer than T1, since the difference between $V_{REF}$ and $V_S$ (on) is brought close to the operating margin α of the comparator 5.

Figure 6:
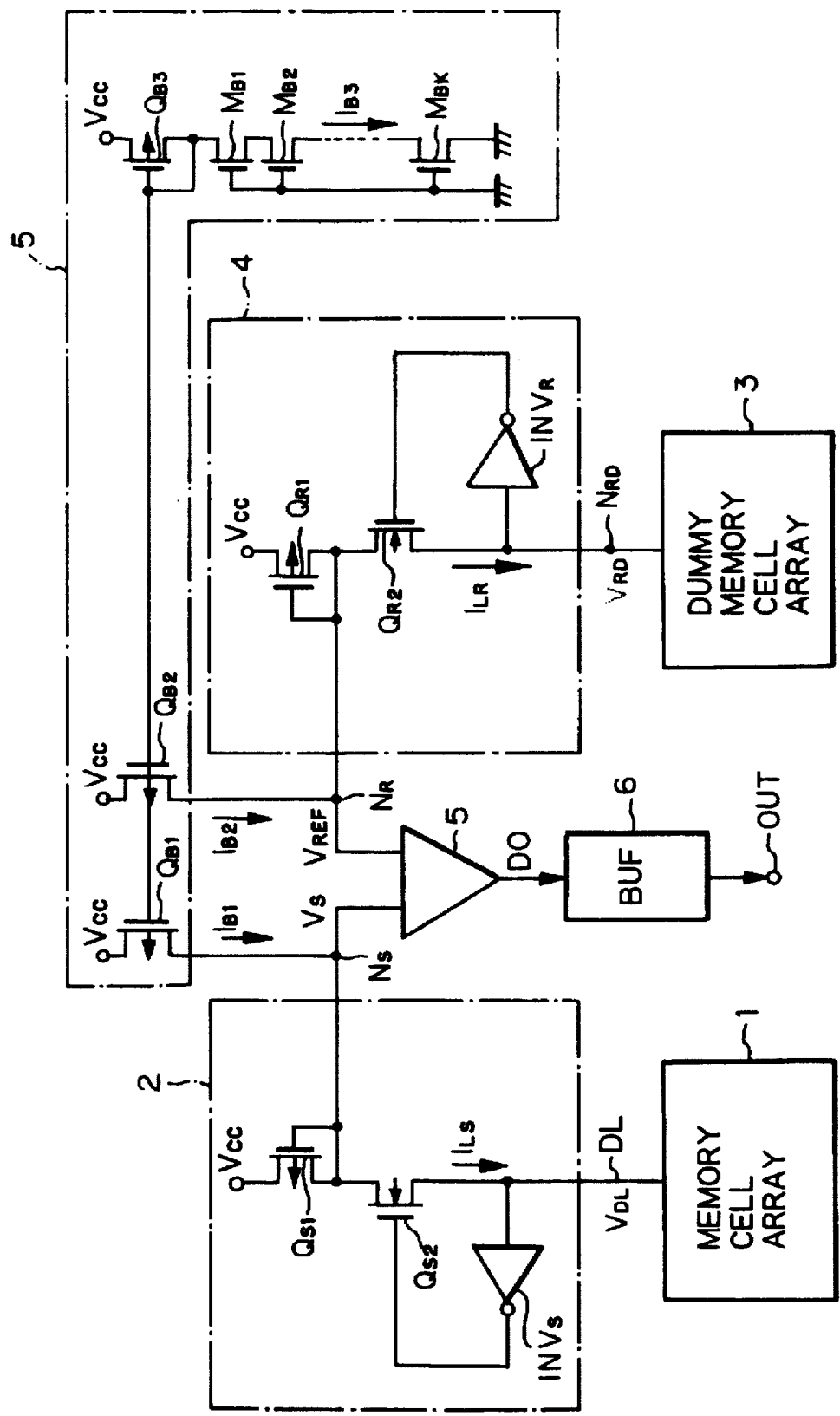
FIG. 6 is a circuit diagram illustrating an embodiment of the ROM type semiconductor memory device according to the present invention.

In FIG. 6, which illustrates an embodiment of the present invention, a bias circuit 5 is added to the elements of FIG. 1.

The bias circuit 5 includes a P-channel enhancement-type MOS transistor $Q_{B1}$, connected between the power supply terminal $V_{CC}$ and the node $N_S$, for supplying a bias current $I_{B1}$ from the power supply terminal $V_{CC}$ to the node $N_S$. In this case, the transistor $Q_{B1}$ is connected in parallel with the transistor $Q_{S1}$, and therefore, the transistor $Q_{B1}$ serves as a load.

Also, the bias circuit 5 includes a P-channel enhancement-type MOS transistor $Q_{S2}$, connected between the power supply terminal $V_{CC}$ and the node $N_R$, for supplying a bias current $I_{B2}$ from the power supply terminal $V_{CC}$ to the node $N_R$. In this case, the transistor $Q_{B2}$ is connected in parallel with the transistor $Q_{R1}$, and therefore, the transistor $Q_{B2}$ serves as a load.

Further, the bias circuit 5 includes a P-channel enhancement-type MOS transistor $Q_{B3}$ and dummy cells $M_{B1}, M_{B2}, \ldots, M_{BK}$ which are of a depletion type and whose gates are grounded.

In the bias circuit 5, the transistor $Q_{B3}$ forms a current mirror circuit with each of the transistors $Q_{B1}$ and $Q_{B2}$. Therefore, since the transistors $Q_{B1}$, $Q_{B2}$ and $Q_{B3}$ have the same configuration, each of bias currents $I_{B1}I_{B2}$ flowing through the transistors $Q_{B1}$ and $Q_{B2}$ is determined by a current $I_{B3}$ flowing through the dummy cells $M_{B1}, M_{B2}, \ldots, M_{BK}$. In this case, the channel width (W)/channel length (L) of the transistors $Q_{B1}$, $Q_{B2}$ and $Q_{B3}$ are 5 μm/5 μm, and therefore, $I_{B1}$=$I_{B2}$=$I_{B3}$.

Figure 7A:
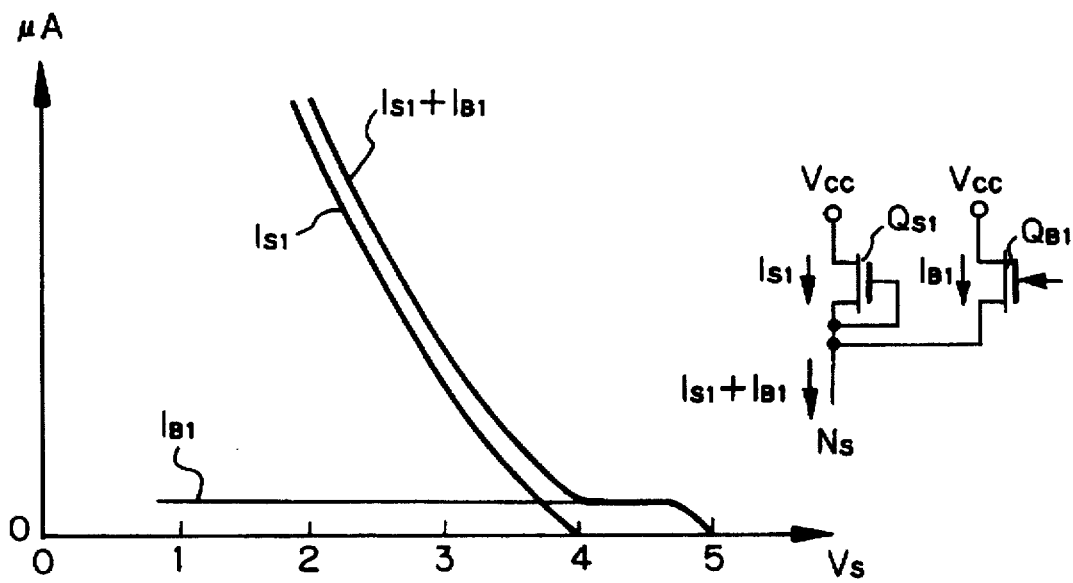
FIG. 7A is a diagram showing the load characteristics of the sense amplifier of FIG. 6.

As stated above, the transistor $Q_{B1}$ as well as the transistor $Q_{S1}$ serves as a load. Therefore, as shown in FIG. 7A, a current $I_{S1}$ flowing through the transistor $Q_{S1}$ and a current $I_{B1}$ flowing through the transistor $Q_{B1}$ are supplied to the node $N_S$. In this case, since the transistor $Q_{B1}$ serves as a constant current source, the voltage at the node $N_S$ is pulled up to $V_{CC}$ even when the transistor $Q_{S1}$ is turned OFF.

Figure 7B:
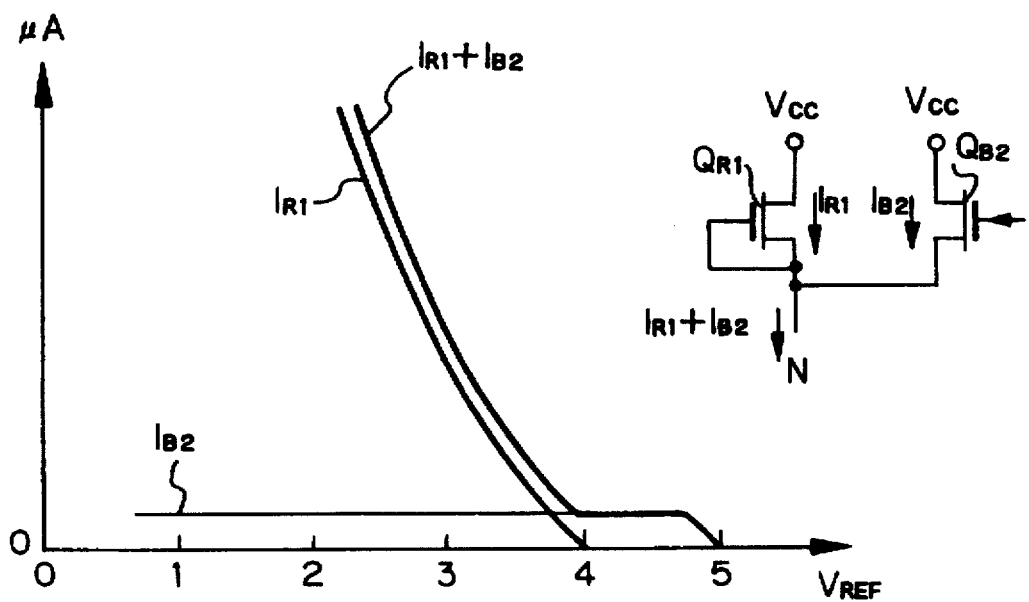
FIG. 7B is a diagram showing the load characteristics of the reference voltage generating circuit of FIG. 6.

Also, as stated above, the transistor $Q_{B2}$ as well as the transistor $Q_{R1}$ serves as a load. Therefore, as shown in FIG. 7B, a current $I_{R1}$ flowing through the transistor $Q_{R1}$ and a current $I_{B2}$ flowing through the transistor $Q_{B2}$ are supplied to the node $N_R$. In this case, since the transistor $Q_{B2}$ serves as a constant current source, the voltage at the node $N_R$ is pulled up to $V_{CC}$ even when the transistor $Q_{R1}$ is turned OFF.

The operation of the device of FIG. 6 where $V_{CC}$=5 V will be explained with reference to FIGS. 8A and 8B.

Figure 8A:
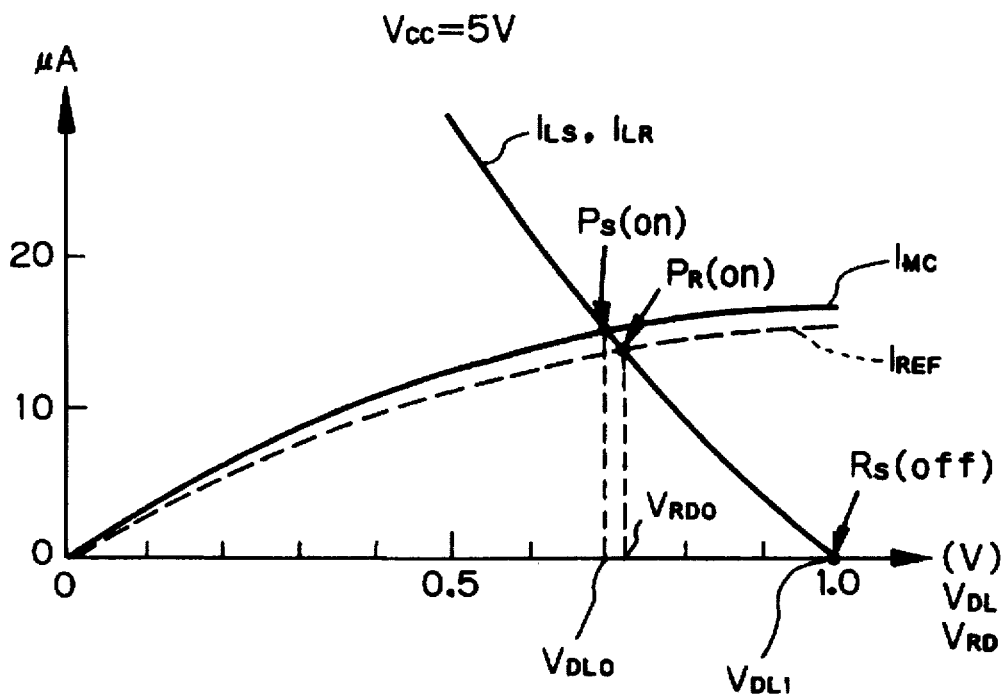
FIG. 8A is a graph showing the current characteristics of the device of FIG. 6 where $V_{CC}=5$ V.

As shown in FIG. 8A, in the same way as in FIG. 2A, the memory cell current $I_{MC}$ in relation to the voltage $V_{DL}$ at the digit line DL is brought close to the reference current $I_{REF}$ in relation to the voltage $V_{RD}$ at the node $N_{RD}$. Also, the load current $I_{LS}$ depends upon only the current driving ability of the transistor $Q_{S2}$ and the input/output characteristics of the inverter $INV_S$. Similarly, the load current $I_{LR}$ depends upon only the current driving ability of the transistor $Q_{R2}$ and the input/output characteristics of the inverter $INV_R$. Therefore, the load currents $I_{LS}$ and $I_{LR}$ as shown in FIG. 8A are the same as these as shown in FIG. 2A.

Figure 8B:
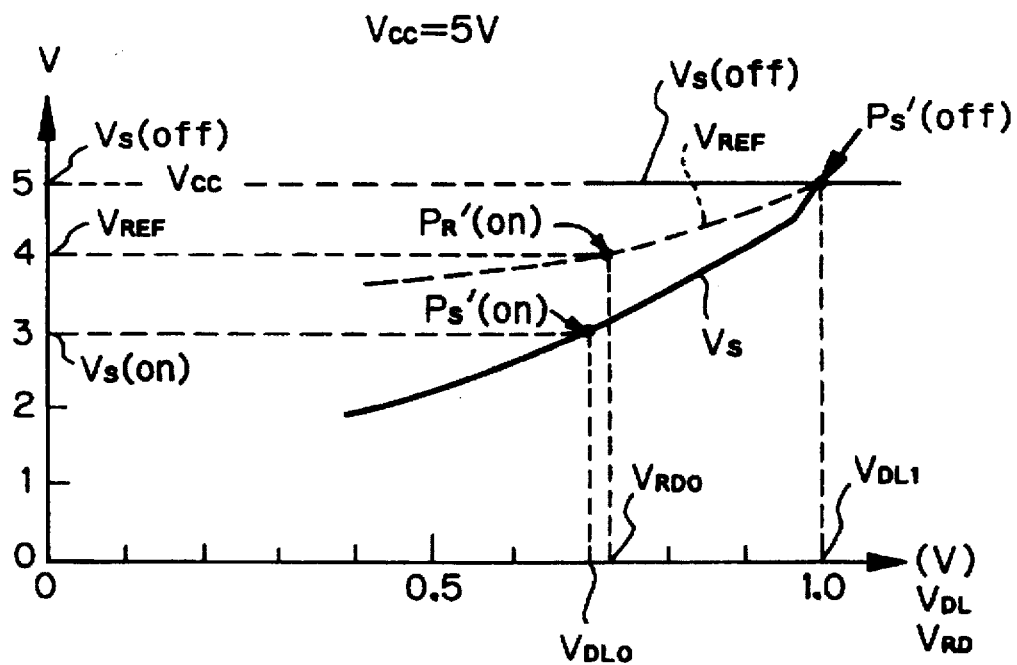
FIG. 8B is a graph showing the voltage characteristics of the device of FIG. 6 where $V_{CC}=5$ V.

If a selected memory cell stores "1" (enhancement-type), the sense amplifier 2 is operated at the operating point $P_S$ (off) of FIG. 8A and the operating point $P_S'$ (off) of FIG. 8B. Therefore, the high sense voltage $V_S$ (off) of the sense amplifier 2 is represented by $$V_S(\text{off}) = V_{CC} \quad (4)$$
$$= 5 \text{ V}$$

If a selected memory cell stores "0" (depletion-type), the sense amplifier 2 is operated at the operating point $P_S$ (on) of FIG. 8A and the operating point $P_S'$ (on) of FIG. 8B. Therefore, the low sense voltage $V_S$ (on) of the sense amplifier 2 is represented by $$V_S(\text{on})=V_{CC}-\beta'>V_{INVS}=1 \text{ V}$$

where β' is determined by the load current $I_{LS}$ and the current driving abilities of the load transistor $Q_{S1}$ and $Q_{S1}$; and $V_{INVS}$ is a threshold voltage such as 1 V of the inverter $INV_S$.

For example, if β'=2.0 V, $$V_S(\text{on}) = 5 \text{ V} - 2.0 \text{ V} \quad (5)$$
$$= 3 \text{ V}$$

Also, the reference voltage generating circuit 4 is operated at the operating point $P_R$ (on) of FIG. 8A and the operating point $P_R'$ (on) of FIG. 8B. Therefore, the reference voltage $V_{REF}$ of the reference voltage generating circuit 4 is represented by $$V_{REF}(\text{on})=V_{CC}-\tau'>V_{INVR}=1 \text{ V}$$

where τ' is determined by the load current $I_{LR}$ and the current driving abilities of the load transistor $Q_{R1}$ and $Q_{B2}$; and $V_{INVR}$ is a threshold voltage such as 1 V of the inverter $INV_R$.

For example, if τ'=1.0 V, $$V_{REF} = 5 \text{ V} - 1.0 \text{ V} \quad (6)$$
$$= 4 \text{ V}$$

Thus, in this case, in view of the formulae (4), (5) and (6), $$V_S \text{ (off)}-V_{REF}=1 \text{ V}>\alpha=0.2 \text{ V}$$

$$V_{REF}-V_S \text{ (on)}=1 \text{ V}>\alpha=0.2 \text{ V}$$

Therefore, the comparator 5 is surely operable by the sense voltage $V_S$ of the sense amplifier 2 and the reference voltage $V_{REF}$ of the reference voltage generating circuit 4.

The operation of the device of FIG. 6 where $V_{CC}$=3 V will be explained with reference to FIGS. 9A and 9B, which correspond to FIGS. 8A and 8B, respectively.

Figure 9A:
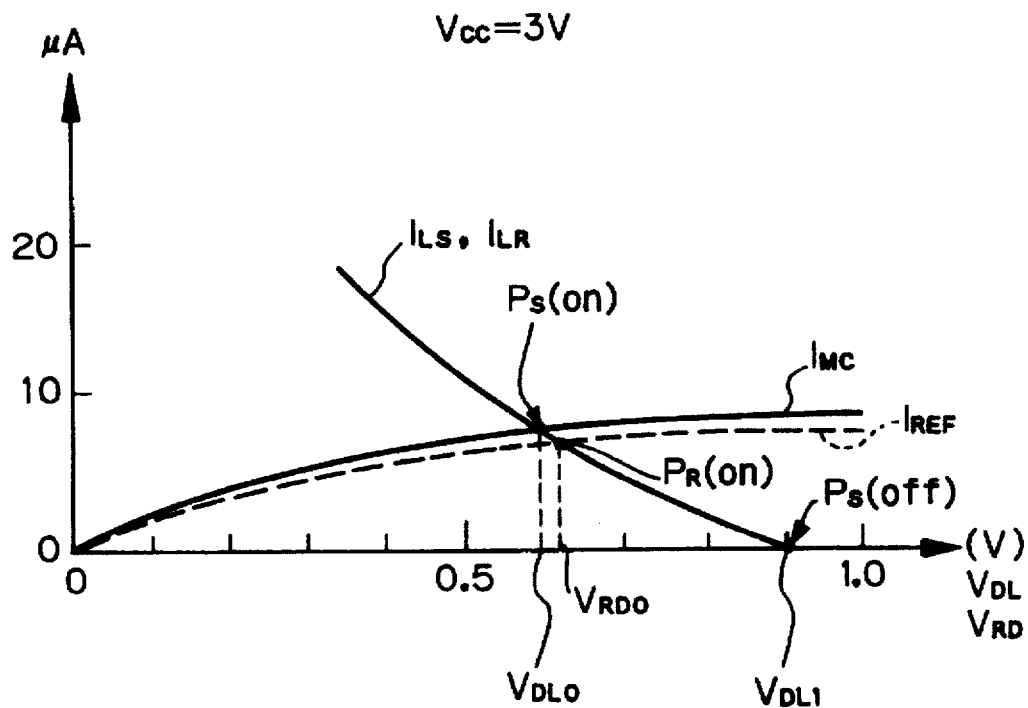
FIG. 9A is a graph showing the current characteristics of the device of FIG. 6 where $V_{CC}=3$ V.

As shown in FIG. 9A, the load currents $I_{LS}$ and $I_{LR}$, the current $I_{MC}$ and the reference current $I_{REF}$ are reduced compared with those of FIG. 8A.

Also, as shown in FIG. 9A, since the threshold voltage $V_{INVS}$ of the inverter $INV_S$ is reduced, the operating point $P_S$ (off) is moved to a lower voltage.

Figure 9B:
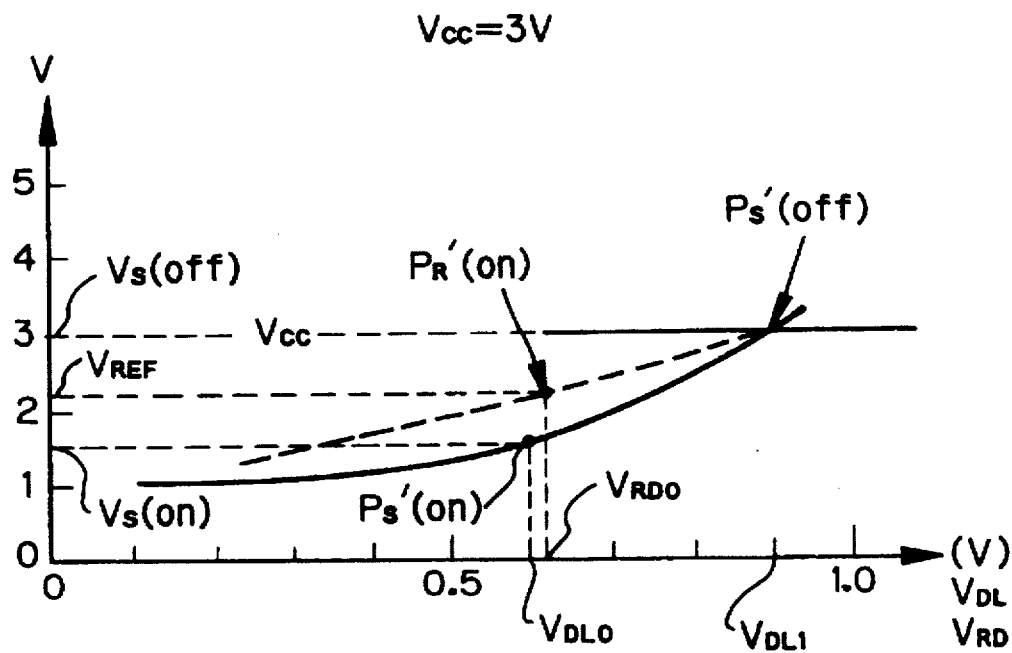
FIG. 9B is a graph showing the voltage characteristics of the device of FIG. 6 where $V_{CC}=3$ V.

If a selected memory cell stores "1" (enhancement-type), the sense amplifier 2 is operated at the operating point $P_S$ (off) of FIG. 9A and the operating point $P_S'$ (off) of FIG. 9B. Therefore, the high sense voltage $V_S$ (off) of the sense amplifier 2 is represented by $$V_S(\text{off}) = V_{CC} \quad (4)'$$
$$= 3 \text{ V}$$

If a selected memory cell stores "0" (depletion-type), the sense amplifier 2 is operated at the operating point $P_S$ (on) of FIG. 9A and the operating point $P_S'$ (on) of FIG. 9B. Therefore, the low sense voltage $V_S$ (on) of the sense amplifier 2 is also represented by $$V_S(\text{on}) = V_{CC} - \beta' > V_{INVS}$$

For example, if $\beta'=1.5$ V, $$V_S(\text{on}) = 3 \text{ V} - 1.5 \text{ V} \quad (5)'$$
$$= 1.5 \text{ V}$$

Also, the reference voltage generating circuit 4 is operated at the operating point $P_R$ (on) of FIG. 9A and the operating point $P_R'$ (on) of FIG. 9B. Therefore, the reference voltage $V_{REF}$ of the reference voltage generating circuit 4 is also represented by $$V_{REF}(\text{on}) = V_{CC} - \tau' > V_{INVR}$$

For example, if $\tau'=0.8$ V, $$V_{REF} = 3 \text{ V} - 0.8 \text{ V} \quad (6)'$$
$$= 2.2 \text{ V}$$

Thus, in this case, in view of the formulae (4)', (5)' and (6)', $$V_S \text{ (off)} - V_{REF} = 0.8 \text{ V} > \alpha = 0.2 \text{ V}$$
$$V_{REF} - V_S \text{ (on)} = 0.7 \text{ V} > \alpha = 0.2 \text{ V}$$

Therefore, the comparator 5 is surely operable by the sense voltage $V_S$ of the sense amplifier 2 and the reference voltage $V_{REF}$ of the reference voltage generating circuit 4, and also, a noise margin and a margin for the fluctuation of process parameters are both increased.

Figure 10:
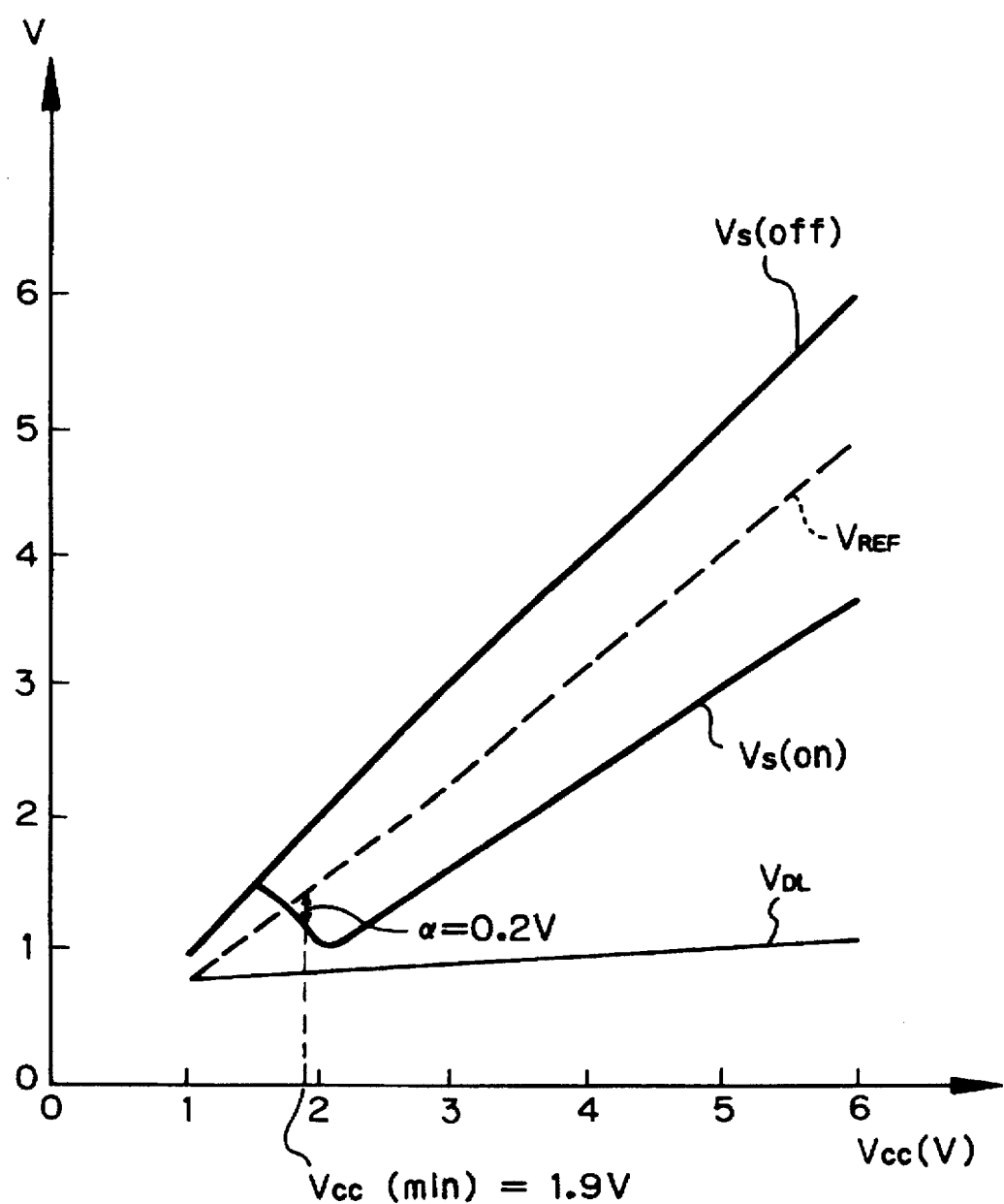
FIG. 10 is a graph showing the output characteristics of the sense amplifier and the reference voltage generating circuit of FIG. 6.

In FIG. 10, which shows the output characteristics of the sense amplifier 2 and the reference voltage generating circuit 4 of FIG. 6, the high sense voltage $V_S$ (off), the low sense voltage $V_S$ (on) and the reference voltage $V_{REF}$ are changed in accordance with the power supply voltage $V_{CC}$. In this case, as represented by the formulae (4)~(6) and (4)'~(6)', the voltages $V_S$ (off), $V_S$ (on) and $V_{REF}$ are dependent upon the power supply voltage $V_{CC}$. Particularly, the voltage $V_S$ (off) is the same as the power supply voltage $V_{CC}$. Also, the voltage $V_S$ (on) is limited by the lower limit $V_{INVS}$ which is the threshold voltage of the inverter $INV_S$. Therefore, when the reference voltage $V_{REF}$ is at an intermediate level between the voltage $V_S$ (off) and $V_S$ (on), a minimum value of the power supply voltage $V_{CC}$ can be 1.9 V in view of the operating margin $\alpha(=0.2$ V) of the comparator 5.

Thus, the device of FIG. 6 is suitable for a lower power supply voltage.

Figure 11:
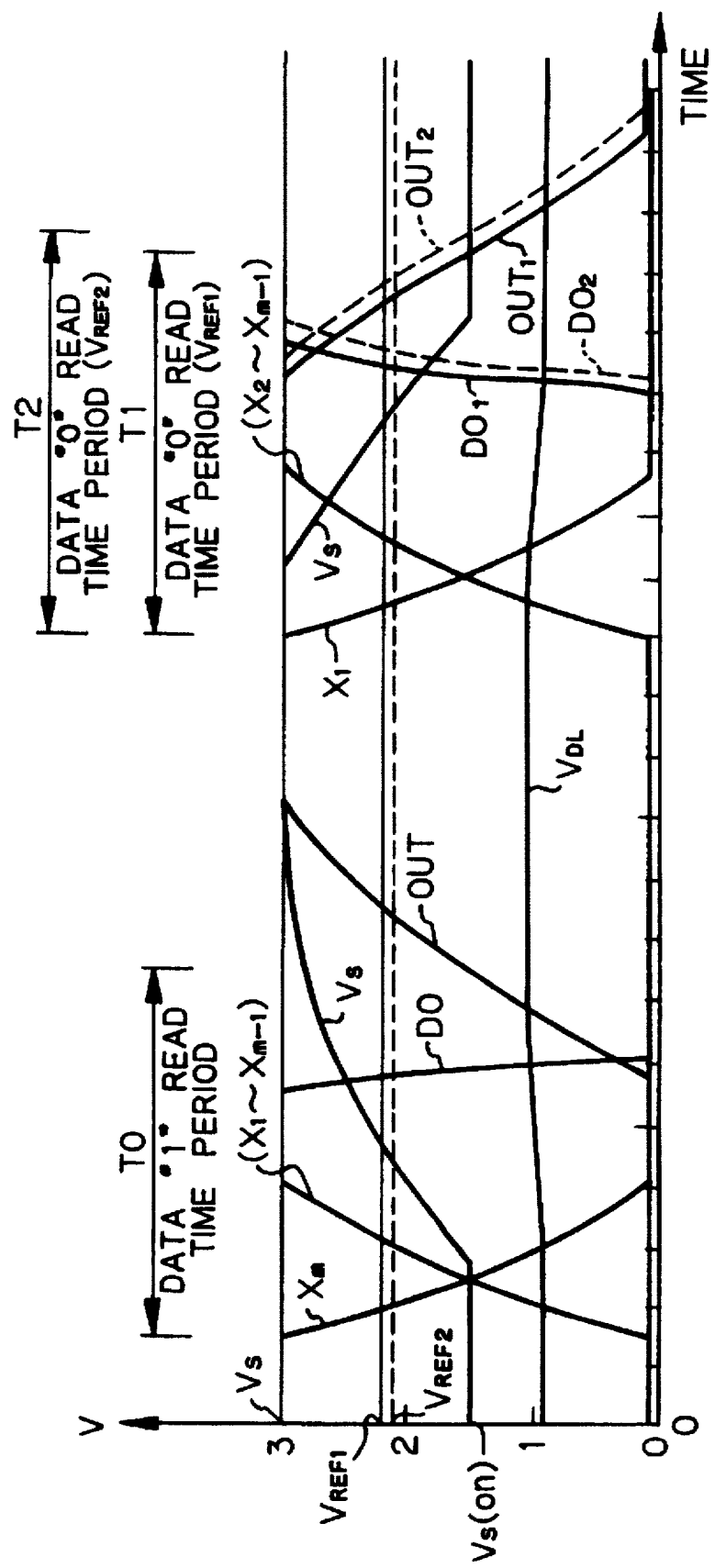
FIG. 11 is a timing diagram showing a read operation of the device of FIG. 6.

Also, the read access speed seldom fluctuates. That is, as shown in FIG. 11, which shows a read operation of the device of FIG. 6 where $V_{CC}=3$ V, if it is assumed that $V_S$ (off)=3.0 V, $V_S$ (on)=1.5 V and $V_{REF}=V_{REF1}$ (=2.2 V), a read time period for reading data "1" is T0, and a read time period for reading "0" is T1. In this case, if the reference voltage $V_{REF}$ is changed from $V_{REF1}$ to $V_{REF2}$ (=2.1 V) due to a fluctuation of the process parameters, a read time period for reading data "0" is T2 and is a little longer than T1, since the difference between $V_{REF}$ and $V_S$ (on) is still larger than the operating margin $\alpha$ of the comparator 5.

In the bias circuit 5 of FIG. 6, use is made of the dummy cells $M_{B1}, M_{B2}, \ldots, M_{BK}$. Therefore, even when the memory cell current $I_{MC}$ and the voltage $V_S$ (on) fluctuate, the reference current $I_{REF}$ also fluctuates, so that the reference voltage $V_{REF}$ fluctuates in association with the fluctuation of the voltage $V_S$ (on). Thus, even when process parameters fluctuate, the read access speed hardly fluctuates.

Figure 12:
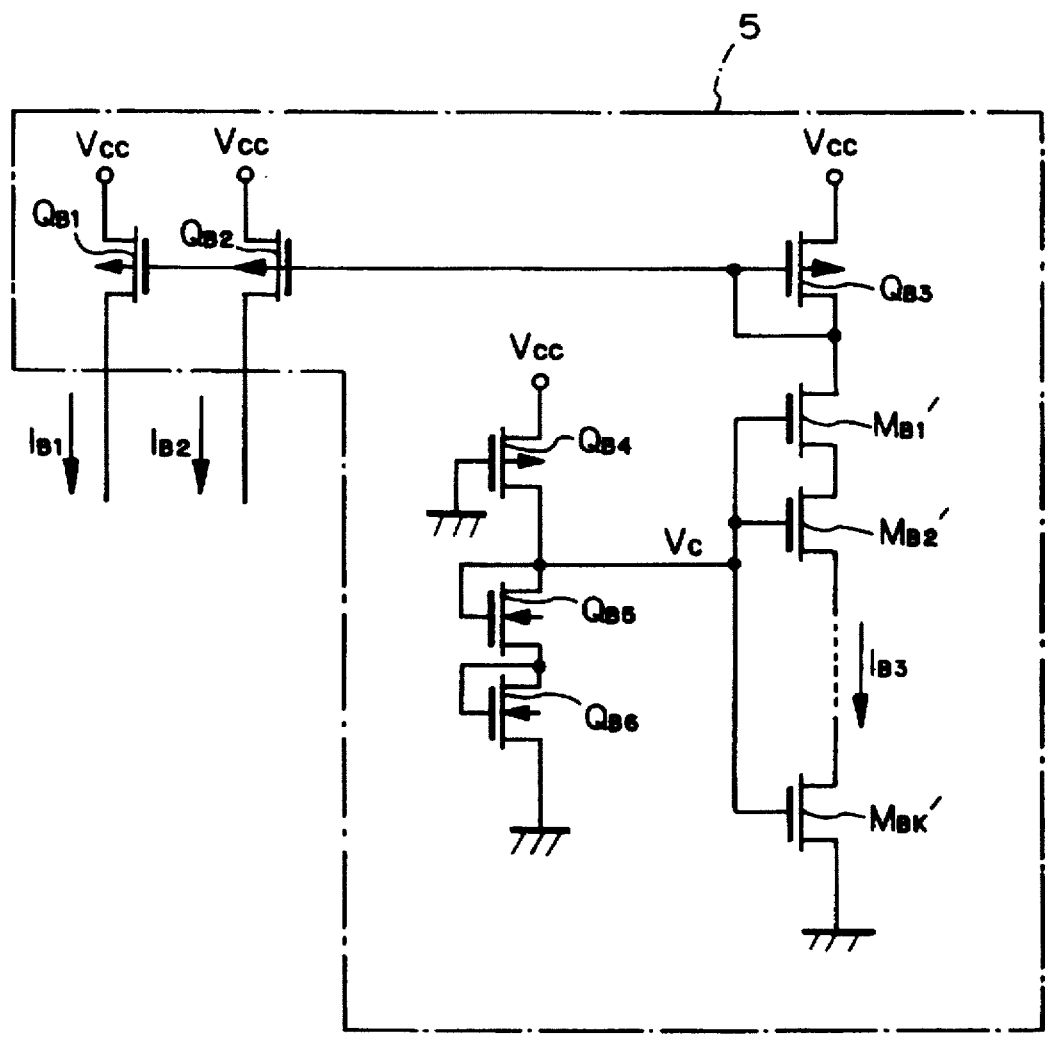
FIGS. 12, 13 and 14 are circuit diagrams illustrating modifications of the bias circuit of FIG. 6.
Figure 13:
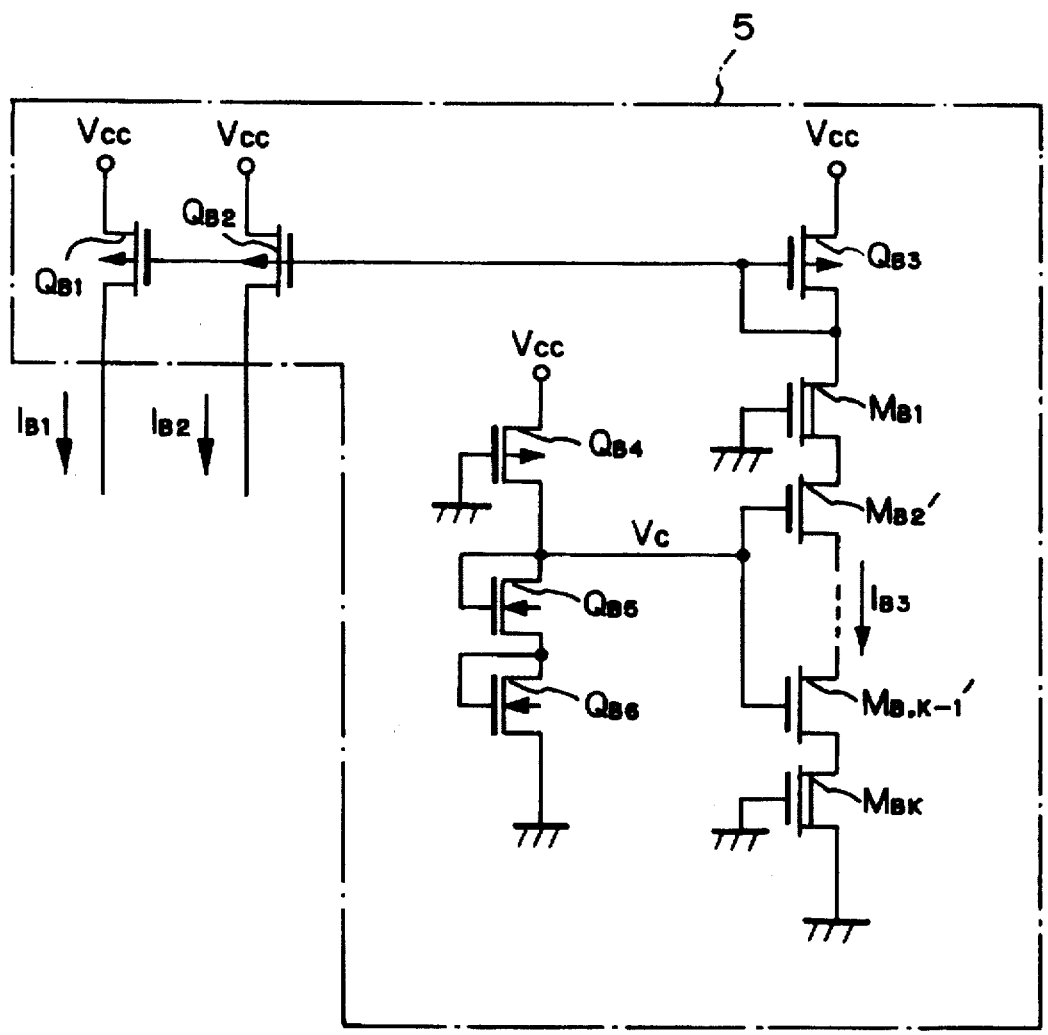
Figure 14:
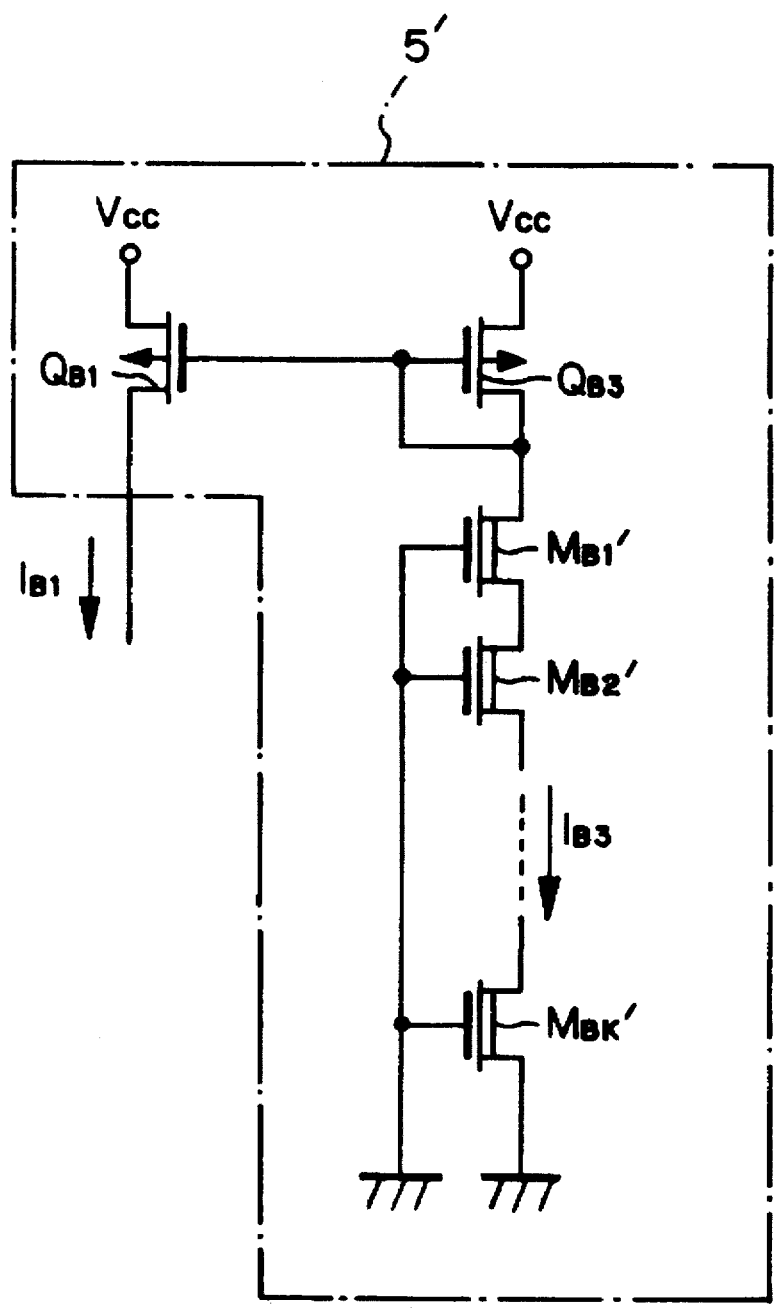

Modifications of the bias circuit 5 of FIG. 6 are illustrated in FIGS. 12, 13 and 14.

In FIG. 12, all the dummy cells $M_{B1}', M_{B2}', \ldots, M_{BK}'$ are of an enhancement type, and a constant voltage $V_C$ is applied to the gates of the dummy cells $M_{B1}', M_{B2}', \ldots, M_{BK}'$ by a constant voltage generating circuit formed by a P-channel enhancement-type MOS transistor $Q_{B4}$ and two N-channel enhancement-type MOS transistors $Q_{B5}$ and $Q_{B6}$. In this case, the current driving ability of the transistor $Q_{B4}$ is sufficiently smaller than those of the transistors $Q_{B5}$ and $Q_{B6}$. Therefore, the constant voltage $V_C$ is determined by $$V_C = 2V_{TN}$$
$$= 1.4 \text{ V}$$

In FIG. 13, some of the dummy cells such as $M_{B1}, \ldots, M_{BK}$ are of a depletion type and their gates are grounded, and the other dummy cells are of an enhancement type and their gates receive the constant voltage $V_C$.

Further, in FIG. 14, the transistor $Q_{B2}$ of FIG. 6 is not provided. In this case, although the reference voltage $V_{REF}$ is a little higher, the high sense voltage $V_S$ (off) can be $V_{CC}$. Therefore, the operating margin can be increased as compared with the prior art.

The present invention can be applied to other mask ROM devices where binary data "0" or "1" corresponds to:

the presence or absence of an enhancement type transistor;

the low or high threshold voltage of a transistor; and the presence or absence of a contact window which connects a transistor to one bit line.

Also, the present invention can be applied to an EPROM device or an EEPROM device where binary data "0" or "1" is determined by introducing carriers into a floating gate.

As explained hereinabove, according to the present invention, the ROM device can be operated at a lower power supply voltage.

I claim:

1. A semiconductor memory device comprising:

first and second power supply means;

a memory cell array including first read-only memory cells, connected to said second power supply means;

a sense amplifier, connected between said first power supply means and an output of said memory cell array, for sensing a voltage at the memory cell array to generate a sense voltage at a first node;

a first dummy memory cell array including second read-only memory cells which are normally turned ON, said first dummy memory cell array being connected to said second power supply means;

a reference voltage generating circuit, connected between said first power supply means and an output of said first dummy memory cell array, for sensing a voltage at the output of said first dummy memory cell array to generate a reference voltage at a second node;

a bias circuit, connected between said first power supply means and said first node and between said first power supply means and said second node, for supplying a first bias current from said first power supply means to said first node and supplying a second bias current from said first power supply means to said second node; and a comparator, connected to said sense amplifier and said reference voltage generating circuit, for comparing the sense voltage with the reference voltage to generate an output signal.

2. The device as set forth in claim 1, wherein said sense amplifier comprises:

a first enhancement type MOS transistor of a first conductivity type having a source connected to said first power supply terminal, a gate connected to said first node, and a drain connected to said first node;

a second enhancement type MOS transistor of a second conductivity type opposite to said first conductivity type, connected between said first node and the output of said memory cell array; and a first inverter connected between a source and a gate of said second enhancement type MOS transistor, said reference voltage generating circuit comprising:

a third enhancement type MOS transistor of said first conductivity type having a source connected to said first power supply terminal, a gate connected to said second node, and a drain connected to said second node;

a fourth enhancement type MOS transistor of said second conductivity type connected between said second node and the output of said dummy memory cell array; and a second inverter connected between a source and a gate of said fourth enhancement type MOS transistor.

3. The device as set forth in claim 1, wherein said bias circuit comprises:

a first enhancement type MOS transistor of a first conductivity type, connected between said first power supply means and said first node;

a second enhancement type MOS transistor of said first conductivity type, connected between said first power supply means and said second node;

a third enhancement type MOS transistor of said first conductivity type, connected between said first power supply means and a third node; and a second dummy memory cell array connected between said third node and said second power supply means, said third node being connected to gates of said first, second and third enhancement type MOS transistors.

4. The device as set forth in claim 3, wherein said second dummy memory cell array comprises dummy cells which are of an enhancement type and whose gates are connected to said second power supply means.

5. The device as set forth in claim 3, wherein said second dummy memory cell array comprises dummy cells which are of a depletion type and whose gates are connected to a constant voltage generating circuit.

6. The device as set forth in claim 3, wherein said second dummy memory cell array comprises:

dummy cells of an enhancement type whose gates are connected to said second power supply means; and dummy cells of a depletion type whose gates are connected to a constant voltage generating circuit.

7. A semiconductor memory device comprising:

first and second power supply means;

a memory cell array including first read-only memory cells, connected to said second power supply means;

a sense amplifier, connected between said first power supply means and an output of said memory cell array, for sensing a voltage at the memory cell array to generate a sense voltage at a first node;

a first dummy memory cell array including second read-only memory cells which are normally turned ON, said first dummy memory cell array being connected to said second power supply means;

a reference voltage generating circuit, connected between said first power supply means and an output of said first dummy memory cell array, for sensing a voltage at the output of said first dummy memory cell array to generate a reference voltage at a second node;

a bias circuit, connected between said first power supply means and said first node, for supplying a bias current from said first power supply means to said first node; and a comparator, connected to said sense amplifier and said reference voltage generating circuit, for comparing the sense voltage with the reference voltage to generate an output signal.

8. The device as set forth in claim 7, wherein said sense amplifier comprises:

a first enhancement type MOS transistor of a first conductivity type having a source connected to said first power supply terminal, a gate connected to said first node, and a drain connected to said first node;

a second enhancement type MOS transistor of a second conductivity type opposite to said first conductivity type, connected between said first node and the output of said memory cell array; and a first inverter connected between a source and a gate of said second enhancement type MOS transistor, said reference voltage generating circuit comprising:

a third enhancement type MOS transistor of said first conductivity type having a source connected to said first power supply terminal, a gate connected to said second node, and a drain connected to said second node;

a fourth enhancement type MOS transistor of said second conductivity type connected between said second node and the output of said dummy memory cell array; and a second inverter connected between a source and a gate of said fourth enhancement type MOS transistor.

9. The device as set forth in claim 7, wherein said bias circuit comprises:

a first enhancement type MOS transistor of a first conductivity type, connected between said first power supply means and said first node;

a second enhancement type MOS transistor of said first conductivity type connected between said first power supply means and a third node; and a second dummy memory cell array connected between said third node and said second power supply means, said third mode being connected to gates of said first and second enhancement type MOS transistors.

10. The device as set forth in claim 9, wherein said second dummy memory cell array comprises dummy cells which are of an enhancement type and whose gates are connected to said second power supply means.

11. The device as set forth in claim 9, wherein said second dummy memory cell array comprises dummy cells which are of a depletion type and whose gates are connected to a constant voltage generating circuit.

12. The device as set forth in claim 9, wherein said second dummy memory cell array comprises:
dummy cells of an enhancement type, whose gates are connected to said second power supply means; and
dummy cells of a depletion type, whose gates are connected to a constant voltage generating circuit.

* * * * *

UNITED STATES PATENT AND TRADEMARK OFFICE
CERTIFICATE OF CORRECTION

PATENT NO. : 5,717,640
DATED : February 10, 1998
INVENTOR(S) : Hashimoto

It is certified that error(s) appears in the above-identified patent and that said Letters Patent is hereby corrected as shown below:

Column 2, line 56, delete "X2" and insert --$X_2$--;

Column 4, line 63, after "stores" insert --0--.

Column 7, line 13, delete "5" and insert --7--;

Column 7, line 15, delete "5" and insert --7--;

Column 7, line 22, delete "5" and insert --7--;

Column 7, line 23, delete "$Q_{S2}$" and insert --$Q_{B2}$--;

Column 7, line 29, delete "5" and insert --7--;

Column 7, line 33, delete "5" and insert --7--;

Column 8, line 21, delete the second occurrence of "$Q_{S1}$" and insert --$Q_{B1}$--;

Column 10, line 7, delete "5" and insert --7--;

Column 12, line 66, delete "mode" and insert --node--.

Signed and Sealed this

Twenty-ninth Day of September, 1998

Attest:

BRUCE LEHMAN

Attesting Officer     *Commissioner of Patents and Trademarks*